United States Patent [19]
Nakagawa et al.

[11] Patent Number: 5,486,238
[45] Date of Patent: Jan. 23, 1996

[54] PHOTOVOLTAIC DEVICE

[75] Inventors: Katsumi Nakagawa; Noboru Toyama, both of Nagahama, Japan

[73] Assignee: Canon Kabushiki Kaisha, Tokyo, Japan

[21] Appl. No.: 347,204

[22] Filed: Nov. 21, 1994

Related U.S. Application Data

[63] Continuation of Ser. No. 964,284, Oct. 21, 1992, abandoned.

[30]     Foreign Application Priority Data

Oct. 22, 1991  [JP]  Japan .................... 3-273974

[51] Int. Cl.⁶ .................. H01L 31/04; H01L 31/0224; H01L 31/0232
[52] U.S. Cl. .............. 136/259; 136/256; 136/258; 257/436
[58] Field of Search ............ 136/256, 258 AM, 136/259; 257/436

[56]           References Cited

U.S. PATENT DOCUMENTS

| | | | |
|---|---|---|---|
| 4,419,533 | 12/1983 | Czubatyj et al. | 136/259 |
| 4,694,317 | 9/1987 | Higashi et al. | 257/446 |
| 4,941,032 | 7/1990 | Kobayashi et al. | 257/53 |
| 5,244,509 | 9/1993 | Arao et al. | 136/259 |

FOREIGN PATENT DOCUMENTS

| | | | |
|---|---|---|---|
| 0132924 | 2/1985 | European Pat. Off. | 136/256 |
| 2550386 | 2/1985 | France | 136/256 |
| 3-99477 | 4/1991 | Japan | 136/259 |
| 2116364 | 9/1983 | United Kingdom | 136/259 |

OTHER PUBLICATIONS

Pat. Abs. Jp. vol. 8, No. 285 (E-287) Dec. 26, 1984 (JP-A-59150485).
Pat. Abs. Jp. vol. 13, No. 509 (E-846) Nov. 15, 1989 (JP-A-1205571).
Pat. Abs. Jp. vol. 4, No. 157 (E-32) Nov. 4, 1980 (JP-A-55108780).

*Primary Examiner*—Aaron Weisstuch
*Attorney, Agent, or Firm*—Fitzpatrick, Cella, Harper & Scinto

[57]           ABSTRACT

A photovoltaic device, such as a solar cell, of improved photoelectric conversion efficiency and improved reliability is provided with a metal layer, a transparent conductive layer formed on the metal layer, and a semiconductor layer formed on the transparent conductive layer and capable of photoelectric conversion. The metal layer is composed of aluminum containing silicon, copper, zinc and/or manganese, or of copper containing silicon, aluminum, zinc, tin, and/or beryllium.

14 Claims, 10 Drawing Sheets

PHOTOVOLTAIC DEVICE

This application is a continuation of application Ser. No. 07/964,284 filed Oct. 21, 1992, abandoned.

BACKGROUND OF THE INVENTION

1. Field of the Invention

The present invention relates to a photovoltaic device, such as a solar cell, realizing high performance and high reliability over a prolonged period, and enabling easy mass production, and, more particularly, to an improved metal layer provided on the photovoltaic device.

2. Related Background Art

As energy sources in the future, total reliance on the fossil fuels, use of which is said to lead to the warming of the earth due to the generation of carbon dioxide, or on atomic energy, which inevitably involves the possible danger of radiation in an unpredictable accident or even in normal operation, involves various problems. For this reason, widespread use has been expected for solar cells which utilize the unlimited energy of the sun and which have only very limited influence on the ecology of the earth. At present, however, such wide use is being prevented by certain drawbacks.

For solar power generation, there has principally been employed monocrystalline or polycrystalline silicon. However, such solar cells are difficult to mass-produce and cannot be provided inexpensively, as they require much time and energy for crystal growth and also complex subsequent steps. On the other hand, much developmental activity has been conducted on solar cells capable of easier mass production, such as those employing amorphous silicon (hereinafter written as a-Si) or so-called thin film semiconductor solar cells employing compound semiconductors, for example, CdS or $CuInSe_2$. Such solar cells offer the possibility of cost reduction, as they can be prepared by forming the necessary semiconductor layers on an inexpensive substrate such as a glass or stainless steel sheet through relatively simple manufacturing steps. However, such thin film solar cells have not been employed widely as they are inferior in conversion efficiency to the crystalline silicon solar cells and are not satisfactory in reliability during prolonged use. For this reason, there have been proposed various methods for improving the performance of the thin film solar cells.

For example, for improving the conversion efficiency, it is proposed to form a rear reflection layer in order to increase the light reflectance on the substrate surface, thereby returning the solar light not absorbed in the thin semiconductor film to the film for achieving effective utilization of the incident light. For this purpose, in the case where the photoelectric conversion layer is formed on a transparent substrate through which the solar light is introduced, the electrode formed on the outer surface of the thin semiconductor layer is preferably formed of a metal with a high reflectance, such as silver (Ag), aluminum (Al), or copper (Cu). Also, in the case where the solar light is introduced from the outer surface of the thin semiconductor film, a similar metal layer is preferably formed on the substrate, prior to the formation of the thin semiconductor film constituting the photoelectric converting layer. A further improvement in the reflectance can be achieved by multiple interference, by forming a transparent layer of a suitable optical property, between the metal layer and the thin semiconductor film. FIGS. 3A, 3B show the result of simulation, indicating that the presence of a transparent zinc oxide (ZnO) layer between silicon and various metals (FIG. 3A) improves the reflectance, in comparison with the configuration without such zinc oxide layer (FIG. 3B).

The use of such transparent layer is also effective in improving the reliability of the thin film solar cells. The Japanese Patent Publication No. 60-41878 discloses that the presence of such transparent layer prevents alloy formation between the semiconductor and the metal layer. Also, the U.S. Pat. Nos. 4,532,372 and 4,598,306 teach that the use of a transparent layer of a suitable resistance can prevent generation of an excessive current even if a short circuiting occurs in the semiconductor layer.

Another method for improving the conversion efficiency of the thin film solar cells consists of forming a fine irregular structure (textured structure) on the surface of the solar cell and/or at the interface with the rear reflection layer. With such structure, the solar light is scattered at the surface of the solar cell and/or at the interface with the rear reflection layer and is enclosed in the semiconductor (light trapping effect), thereby being effectively absorbed therein. In the case where the substrate is transparent, the irregular structure is preferably formed on the surface of a transparent electrode, such as of tin oxide ($SnO_2$) formed on the substrate. In the case where the solar light is introduced from the surface of the thin semiconductor film, the irregular structure is preferably formed on the surface of the metal layer constituting the rear reflection layer. M. Hirasaka, K. Suzuki, K. Nakatani, M. Asano, M. Yano and H. Okaniwa (Solar Cell Materials, 20(1990), pp. –110) reported that the irregular structure for the rear reflection layer could be obtained by aluminum deposition with regulation of the substrate temperature and the deposition rate. FIGS. 4 and 5 show examples of an increase of absorption of the incident light, by employing such irregular surface structure in the rear reflection layer. In FIG. 4, curve (a) indicates the spectral sensitivity of an a-Si solar cell employing a smooth Al layer, while curve (b) indicates that of an a-Si solar cell employing an Al layer with irregular surface structure. In FIG. 5, curve (a) indicates the spectral sensitivity of an a-SiGe solar cell employing a smooth Cu metal layer, while curve (b) indicates that of a similar cell employing a Cu layer with irregular surface structure.

It is also possible to combine the concept of the rear reflection layer consisting of a metal layer and a transparent layer, with the concept of the irregular surface structure. The U.S. Pat. No. 4,419,533 discloses the concept of the rear reflection layer in which the surface of a metal layer has irregular structure and a transparent layer is formed thereon.

Use of aluminum or copper as the metal layer of the rear reflection layer is extremely useful in obtaining a solar cell with a low manufacturing cost and a high conversion efficiency. However, the conventional rear reflection layer in which the metal layer or a substrate serving as the metal layer and composed of aluminum or copper cannot necessarily provide sufficient reliability in use under harsh conditions such as high temperature and high humidity, resulting eventually in a significant loss in the conversion efficiency. For this reason, such thin film semiconductor solar cells have not been commercially employed for solar power generation, though they offer the possibility of inexpensive manufacture.

SUMMARY OF THE INVENTION

In consideration of the foregoing, the object of the present invention is to provide a photovoltaic device with a higher conversion efficiency, higher reliability and a lower cost than in the prior art, through the use of an improved rear reflection layer.

The present inventors have found that the rear reflection layer employing aluminum or copper as the metal of high reflectance has been associated with the following drawbacks to be resolved:

(1) Variation in the transparent layer due to diffusion of aluminum or copper atoms:

The deposition of the thin semiconductor film on the rear reflection layer is usually conducted at a substrate temperature of 200° C. or higher. At such temperature, there may result diffusion of aluminum or copper atoms into the transparent layer. Such aluminum or copper atoms may function as a dopant, thus giving rise to a change in the ohmic or chemical resistance of the transparent layer which itself is a semiconductor.

An excessively high resistance results in a series resistance loss in the circuit, while an excessively low resistance leads to an inability to suppress the current in a short circuited portion. Also, a lowered resistance to chemical erosion results in defect formation by chemical reaction, such as by etchant(s) used in the subsequent steps;

(2) Diffusion of aluminum or copper atoms into the thin semiconductor film:

Also, if the aluminum or copper atoms diffuse through the transparent layer and come into direct contact with the thin semiconductor film, there will result a reaction between aluminum or copper and the semiconductor, thus damaging the semiconductor junction. In an extreme case, short circuiting may occur between the semiconductor and the transparent electrode;

(3) Increase of diffusion by irregular structure:

If an irregular surface structure is used in the transparent layer, or in the transparent layer and the aluminum or copper layer, the diffusion of aluminum or copper atoms increases due to an increase in the surface area in such structure.

Through the investigation of these drawbacks, the present inventors have ascertained the basic concept of the present invention, explained in the following:

The photovoltaic device of the present invention, having a transparent conductive layer formed on a metal layer and a semiconductor photoelectric conversion layer provided on the transparent conductive layer, is characterized by the metal layer being composed of copper containing at least one of silicon, aluminum, zinc, and tin.

Also, the photovoltaic device, having a transparent layer formed on a metal layer and a semiconductor photoelectric conversion layer provided on the transparent layer, is characterized by the metal layer being composed of aluminum containing at least one of silicon, copper, zinc, and manganese.

The device is further characterized by the surface of at least said transparent layer having an irregular structure.

BRIEF DESCRIPTION OF THE DRAWINGS

FIGS. 3A and 3B are charts showing the effect of a ZnO layer on the reflectance at the interface between silicon and metal, wherein FIG. 3A shows the reflectance in the absence of a ZnO layer while FIG. 3B shows the reflectance in the presence of ZnO;

DETAILED DESCRIPTION OF THE PREFERRED EMBODIMENTS

Figure 1:
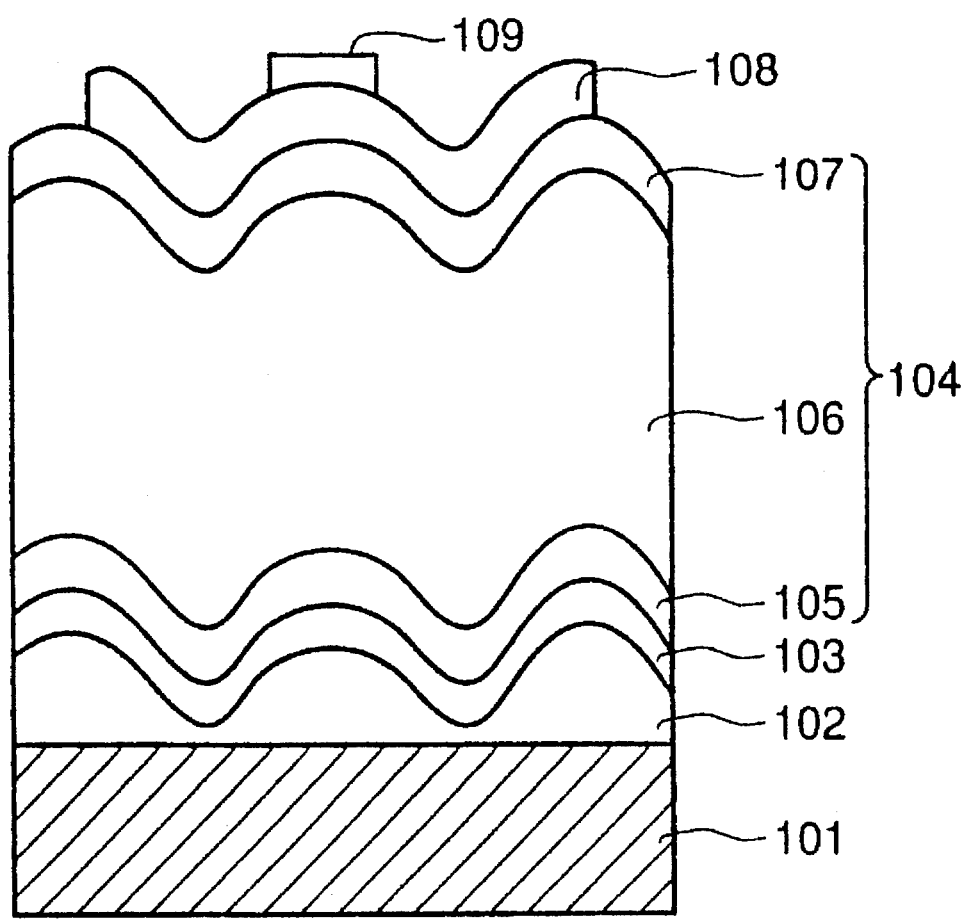
FIG. 1 is a cross-sectional view of a photovoltaic device of the present invention, wherein the aluminum or copper layer has an irregular surface structure.
Figure 2:
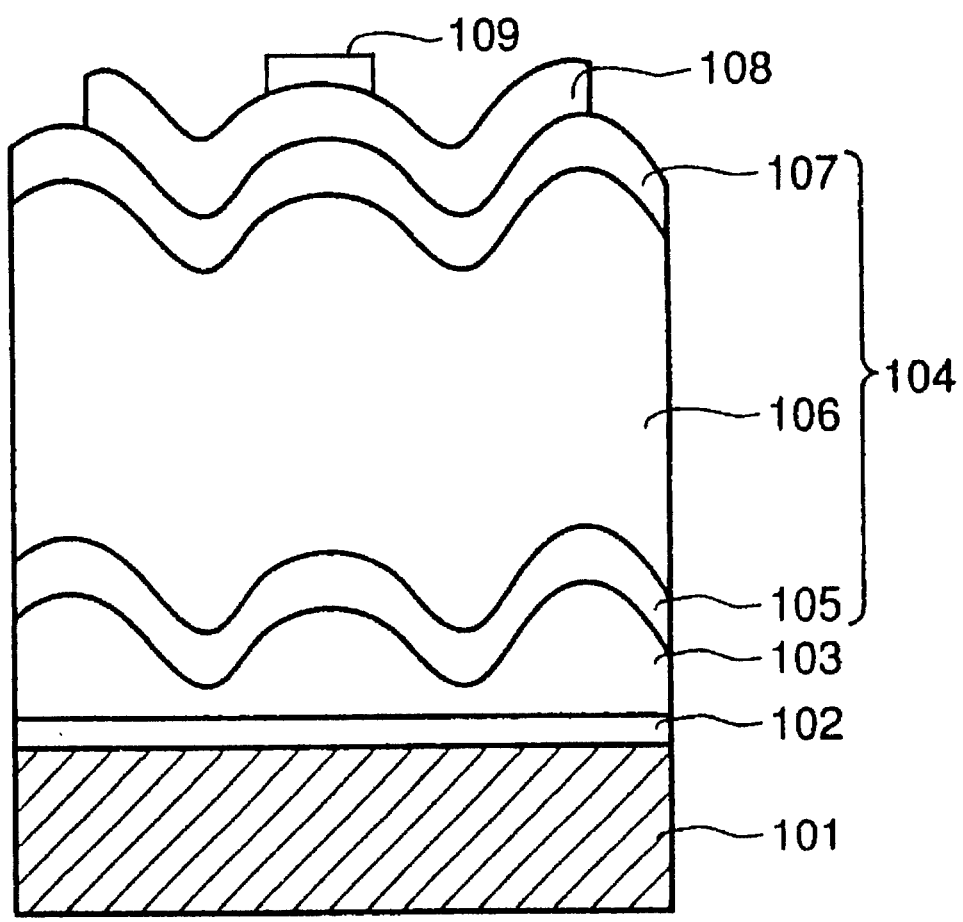
FIG. 2 is a cross-sectional view of a photovoltaic device of the present invention, wherein the aluminum or copper layer is smooth while the transparent layer has an irregular surface structure.
Figure 3A:
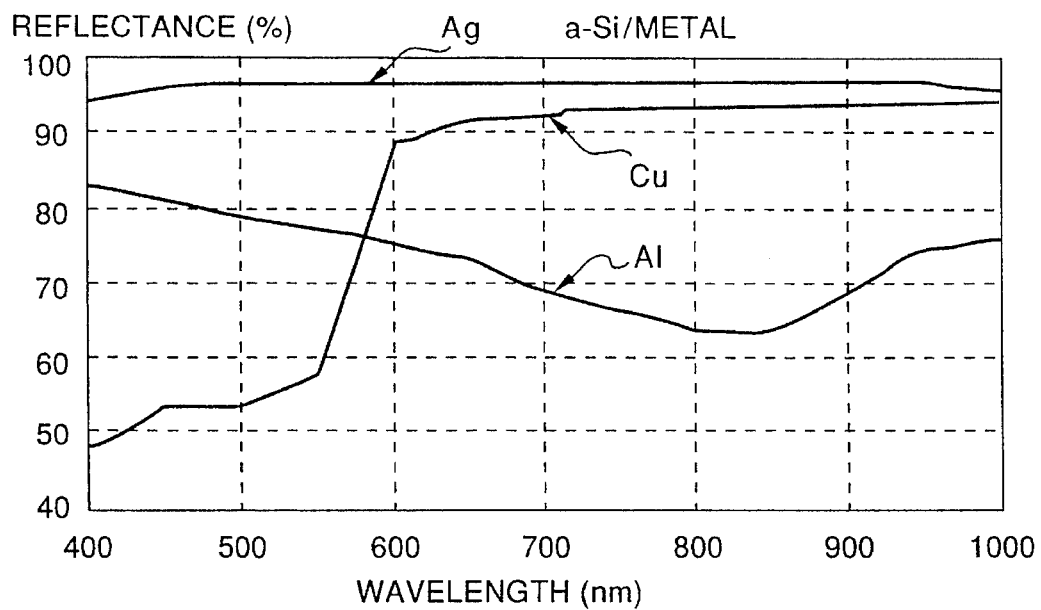
Figure 3B:
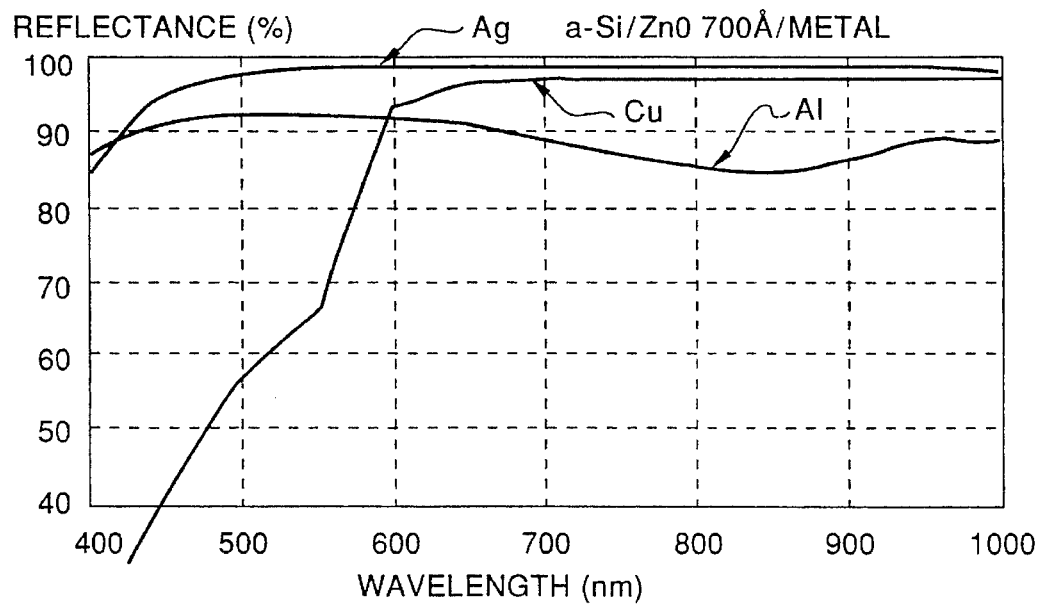
Figure 4:
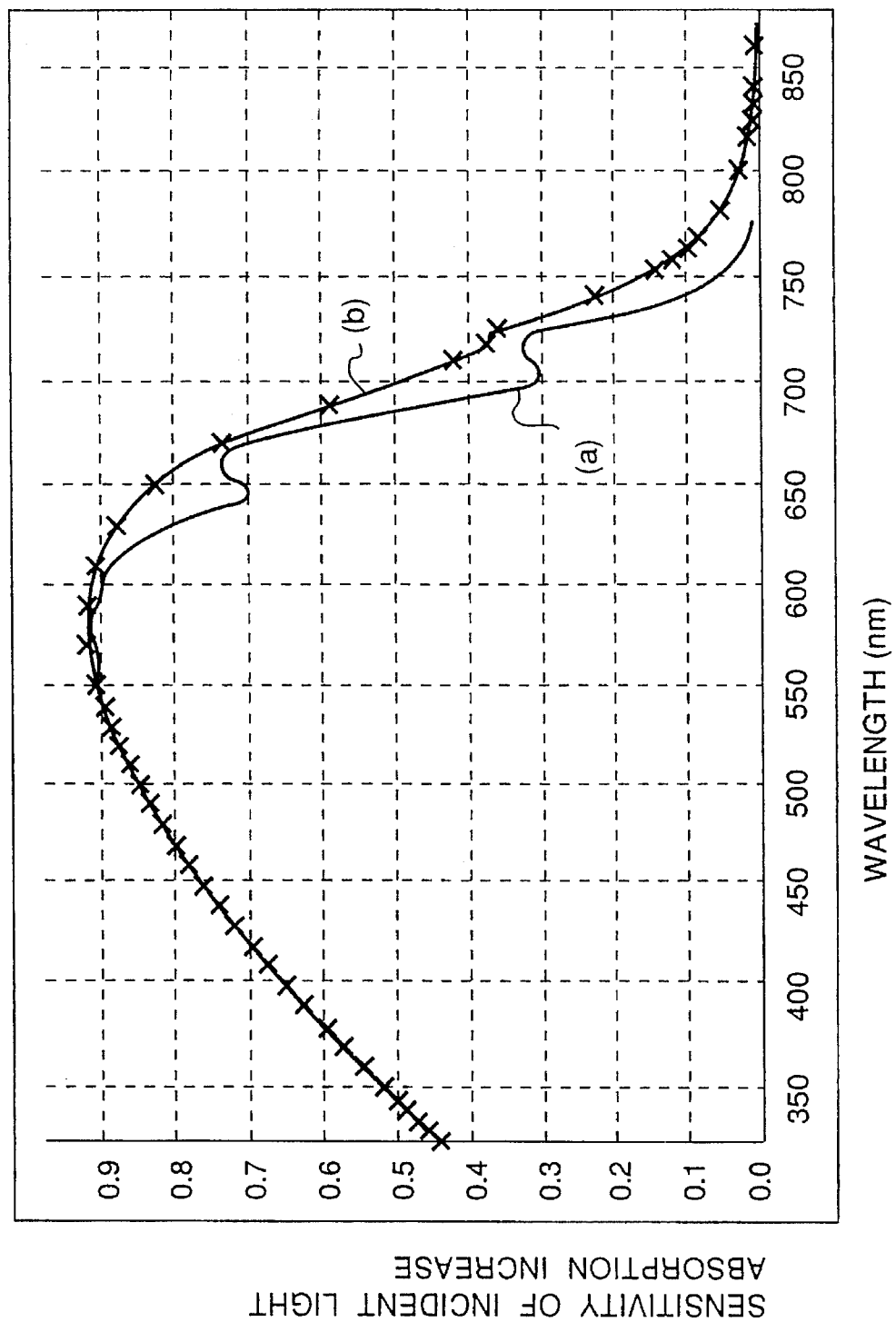
FIG. 4 is a chart showing the improvement in the spectral sensitivity of a solar cell by the irregular surface structure when aluminum is employed as the metal layer.
Figure 5:
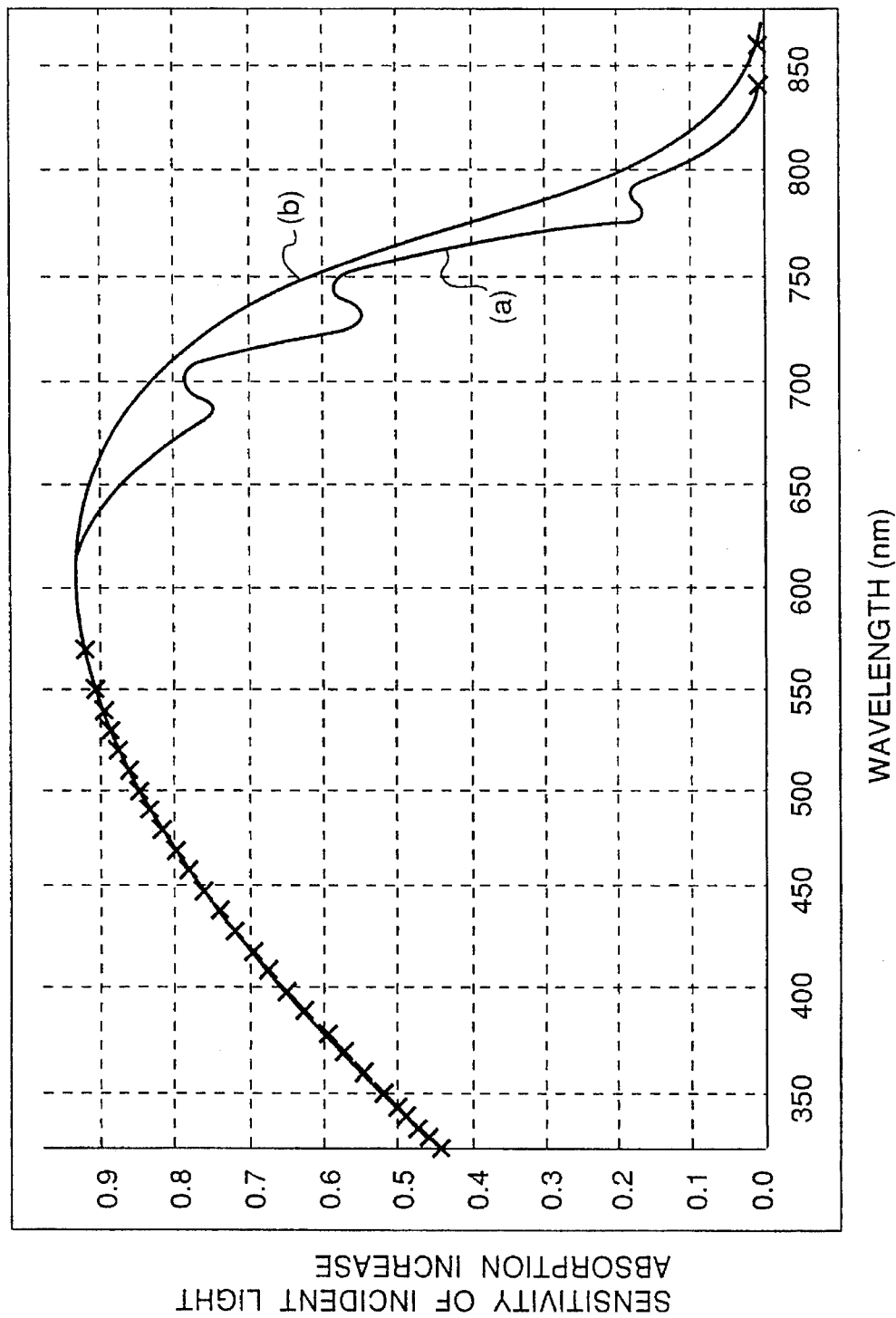
FIG. 5 is a chart showing the improvement in the spectral sensitivity of a solar cell by the irregular surface structure when copper is employed as the metal layer.

FIGS. 1 and 2 show examples of the structure of the thin film solar cell of the present invention. On a conductive substrate 101, there if formed an aluminum or copper layer 102, containing a suitable impurity. A transparent conductive layer 103 is formed thereon, and the rear reflection layer is constituted by the aluminum or copper metal surface and the transparent layer. The transparent conductive layer needs only to be transparent to the solar light transmitted by the thin semiconductor film. In FIG. 1, the aluminum or copper layer (metal layer) 102 has an irregular surface structure, while, in FIG. 2, the aluminum or copper layer is flat but the transparent layer has an irregular surface structure. A thin film semiconductor junction 104 is formed thereon. In the illustrated structures, the junction is composed of an a-Si photovoltaic device of PIN type, but there may also be employed a tandem cell structure or a triple cell structure in which a plurality of a-Si PIN photovoltaic units are laminated. The junction is composed of an n-type a-Si layer 105, an i-type a-Si layer 106, and a p-type a-Si layer 107. If the junction 104 is thin, the entire junction often shows the irregular structure similar to that of the surface of the transparent layer, as shown in FIGS. 1 and 2. There are also provided a transparent electrode 108 on the surface of the junction 104, and a current-collecting electrode 109, for example, of comb shape, formed thereon. The above-explained structure provides the following advantages:

(1) Reflectance of solar light is high because of the use of aluminum or copper as the metal layer 102;

(2) The irregular surface structure of the transparent layer 103 generates a light trapping effect in the thin film semiconductor junction 104, whereby the incident solar light is effectively absorbed to improve the conversion efficiency of solar cell;

(3) Presence of a suitable impurity in the aluminum or copper layer 102 suppresses the diffusion of the aluminum or copper atoms into the transparent layer 103 or the thin film semiconductor junction 104. For this reason, the transparent layer 103 shows stable electrical and chemical resistance, leading to improved reliability.

Although the detailed mechanism is not yet known, the presence of such impurity is presumed to prevent rapid change of the aluminum or copper atoms, in comparison with the case in which the transparent layer or the semiconductor layer is directly laminated on the aluminum or copper layer, thereby retarding the diffusion and stabilizing the chemical resistance; and (4) When the surface area is increased, for example, by the irregular surface structure, the reliability is improved by the suppressed metal diffusion.

The concentration of the impurity contained in the aluminum or copper layer can be made as high as 40 wt. % in the case of zinc, but, in practice, can be selected within a range not reducing the reflectance of the metal layer, preventing the diffusion therefrom and enabling easy alloy formation. More specifically, the preferred range is from 0.5 to 10.0 wt. % in the case where Si, Cu, or Zn is contained in Al; 0.1 to 2.0 wt. % in the case where Mn is contained in Al; 0.5 to 10.0 wt. % in the case where Si, Al, Zn, or Sn is contained in Cu; and 0.1 to 2.0 wt. % in the case where Be is contained in Cu.

In the following there will be explained experiments for proving the effect of the present invention.

Experiment 1

On a stainless steel plate (SUS 430) of 5×5 cm, an Al layer was deposited with a thickness of 3000 Å by DC magnetron sputtering, employing an Al target containing 10 wt. % Si, with a substrate temperature of 250° C. Under SEM observation, the Al surface was turbid, showing concentrated projections of a diameter of 4,000 to 6,000 Å, considered to be crystal grains. A ZnO film was deposited thereon with a thickness of 700 Å by DC magnetron sputtering, with a substrate temperature of 100° C. On the rear reflection layer thus formed, there were formed, by glow discharge decomposition with a substrate temperature of 300° C., an n-type a-Si layer of a thickness of 200 Å from $SiH_4$ and $PH_3$, an i-type a-Si layer of a thickness of 4,000 Å from $SiH_4$, and a p-type microcrystalline (μc) Si layer of a thickness of 100 Å from $SiH_4$, $BF_3$, and $H_2$. (The amorphous silicon deposited by glow discharge decomposition of $SiH_4$, etc. is generally written as a-Si:H because it contains hydrogen in an amount of about 10%, but it is represented as a-Si in the present text for the purpose of simplicity.) Then, a transparent electrode consisting of an ITO film was deposited with a thickness of 650 Å by resistance-heated evaporation, and a current-collecting electrode of a width of 300 microns was formed thereon by screen printing of silver paste to form a sample 1a.

Also, a sample 1b was prepared in the same manner as the sample 1a, except that the Al layer was formed with an Al target containing 3 wt. % Si.

Also, a sample 1c was prepared in the same manner as the sample 1a, except that the Al layer was formed with an Al target containing 0.5 wt. % Si.

Also, a sample 1d was prepared in the same manner as the sample 1a, except that the Al layer was formed with a pure Al target.

Also, a sample 1e was prepared in the same manner as the sample 1b, except that the Al deposition was conducted with the substrate at room temperature, and the ZnO film was deposited at a temperature of 250° C. and with a thickness of 4,000 Å.

According to analyses, the deposited Al layer contained Si in a concentration substantially equal to that in the target.

The five samples thus prepared were subjected to the measurement of solar cell conversion efficiency, under a solar simulator of AM-1.5, and the obtained results are summarized in Table 1. The sample 1d showed a conversion efficiency considerably lower than that of the others, and this is considered to have resulted from short circuiting, based on detailed analysis of the solar cell characteristics. Also, the surfaces of the samples were observed under a metal microscope, with a magnification of 500 times. The sample 1d showed spot-shaped discoloration over the entire surface, and Auger analysis of the discolored portion revealed the presence of Al on the surface of Si. The sample 1e showed the highest efficiency, presumably because the smooth Al surface provided the highest reflectance.

Experiment 2

A sample 2a was prepared in the same manner as the sample 1a in the experiment 1, except that an Al target containing 3 wt. % zinc (Zn) was employed.

Also, a sample 2b was obtained in the same manner as the sample 1a, except that an Al target containing 3 wt. % copper (Cu) was employed.

Also, a sample 2c was obtained in the same manner as the sample 1a, except that an Al target containing 1 wt. % manganese (bin) was employed.

According to analyses, the deposited Al layer contained the impurity metal in a concentration substantially equal to that in the target. The three samples thus prepared were subjected to the measurement of solar cell conversion efficiency, under a solar simulator of AM-1.5, and the obtained results are summarized in Table 2. The surfaces of the samples were observed under a metal microscope with a magnification of 500 times, but no abnormality could be observed.

Also, the rear reflection layers employed in the foregoing samples (deposited up to the ZnO layer) were placed at 300° C. for 2 hours. Then, a Cr electrode having an area of 1 $cm^2$ was formed on each ZnO layer, and the resistance was measured under a current of 20 mA obtained with a constant current source. All the samples showed scarcely any change in the resistance before and after the heating.

Experiment 3

A sample 3a with a rear reflection layer was prepared in the same manner as the sample 1a in the experiment 1.

Also, a sample 3b was obtained in the same manner as the sample 3a, except that the Al layer was deposited from a pure Al target.

Both samples were placed at 300° C. for 2 hours, and then immersed in a 30% aqueous solution of ferric chloride for 5 minutes. The aqueous solution is the etchant employed in the patterning of ITO. The sample 3a did not show any particular change, but the sample 3b showed significant erosion of ZnO. This fact suggests that the rear reflection layer of the sample 3a will be less liable to be damaged in the subsequent steps, even if the thin semiconductor films contain defects such as pinholes. Also, the SIMs analysis indicated that the sample 3b immediately after heating showed Al diffusion into the transparent layer.

Experiment 4

On a stainless steel plate (SUS 430) of 5×5 cm, a Cu layer was deposited with a thickness of 3000 Å by DC magnetron sputtering, employing a Cu target containing 10 wt. % Si, with a substrate temperature of 300° C. Under SEM observation, the Cu surface was turbid, showing concentrated projections of a diameter of 5,000 to 7,000 Å, considered to be crystal grains. A ZnO film was deposited thereon with a thickness of 700 ⌒ by DC magnetron sputtering, with a substrate temperature of 100° C. On the rear reflection layer thus formed, there were deposited, by glow discharge decomposition with a substrate temperature of 300° C., an n-type a-Si layer of a thickness of 200 Å from $SiH_4$ and $PH_3$ as raw material gases, an i-type a-Si layer of a thickness of 4,000 Å from $SiH_4$ as a raw material gas, and a p-type microcrystalline (μc) Si layer of a thickness of 100 Å from $SiH_4$, $BF_3$, and $H_2$ as raw material gases to form a thin film semiconductor junction. Then a transparent electrode consisting of an ITO film was deposited with a thickness of 650 Å by resistance-heated evaporation, and a current-collecting electrode of a width of 300 microns was formed thereon by screen printing of silver paste to form a sample 5a.

Also, a sample 5b was prepared in the same manner as the sample 5a, except that the Cu layer was formed from a Cu target containing 3 wt. % Si.

Also, a sample 5c was prepared in the same manner as the sample 5a, except that the Cu layer was formed from a Cu target containing 0.5 wt. % Si.

Also, a sample 5d was prepared in the same manner as the sample 5a, except that the Cu layer was formed from a pure Cu target.

Also, a sample 5e was prepared in the same manner as the sample 5b, except that the substrate during the Cu deposition was maintained at room temperature and the ZnO layer was deposited at 250° C. with a thickness of 4,000 Å.

Also, a sample 5f was prepared in the same manner as the sample 5d, except that the substrate during the Cu deposition was maintained at room temperature and the ZnO layer was deposited at 250° C. with a thickness of 4,000 Å.

According to analyses, the deposited Cu layer contained Si in a concentration substantially the same as that in the target. The six samples thus prepared were subjected to the measurement of solar cell conversion efficiency, under a solar simulator of AM-1.5, and the obtained results are summarized in Table 5. The sample 5d showed a considerably lower conversion efficiency than the others, presumably because of an extremely elevated series resistance, according to detailed examination of the solar cell characteristics. Also, the sample 5f showed deterioration of the characteristics, and the formation of short circuits was observed. The sample 5e showed the highest efficiency, presumably because the smooth Cu surface provided the highest reflectance.

Experiment 5

A sample 6a was prepared in the same manner as the sample 5a in the experiment 4, except that a Cu target containing 3 wt. % aluminum was employed.

A sample 6b was prepared in the same manner as the sample 5a in the experiment 4, except that a Cu target containing 3 wt. % zinc (Zn) was employed.

A sample 6c was prepared in the same manner as the sample 5a, except that a Cu target containing 3 wt. % tin (Sn) was employed.

A sample 6d was prepared in the same manner as the sample 5a, except that a Cu target containing 1 wt. % beryllium (Be) was employed.

According to analyses, the deposited Cu layer contained the impurity metal in a concentration substantially equal to that in the target. The four samples thus prepared were subjected to the measurement of solar cell conversion efficiency under a solar simulator of AM-1.5, and the obtained results are summarized in Table 6. All the samples showed satisfactory results. The sample surfaces were also observed under a metallurgical microscope with a magnification of 500 times, but no abnormality could be observed.

Also, the rear reflection layers employed in the foregoing samples (deposited up to the ZnO layer) were placed at 300° C. for 2 hours. Then a Cr electrode having an area of 1 $cm^2$ was formed on each ZnO layer, and the resistance was measured under a current of 20 mA obtained with constant current source. All the samples showed scarcely any change in the resistance before and after the heating.

Experiment 6

The rear reflection layer of the sample 5a was used as a sample 7a.

Also, the rear reflection layer of the sample 5d was used as a sample 7b and the rear reflection layer of the sample 5f was used as a sample 7c.

These samples were heated at 700° C. for 2 hours. According to SIMS analysis, the sample 7b after heat treatment showed Cu diffusion into the transparent layer, so that the low performance of the sample 5d in the experiment 4 is presumably ascribable to an excessively high resistance of the transparent layer, caused by Cu diffusion. Also, the surface of the sample 5f after heat treatment, when observed under a metallurgical microscope with a magnification of 500 times, revealed partial peeling of the ZnO layer. When the ZnO layer of this sample was etched off with acetic acid, the Cu surface was found to be coarse. Thus the peeling of the ZnO layer was presumably induced by the surface form change during heat treatment.

Experiment 7

There was prepared a DC magnetron sputtering apparatus provided with two independent targets, in which the substrate successively passes in a position opposed to these targets, by means of rotation of a substrate holder.

Figure 10:
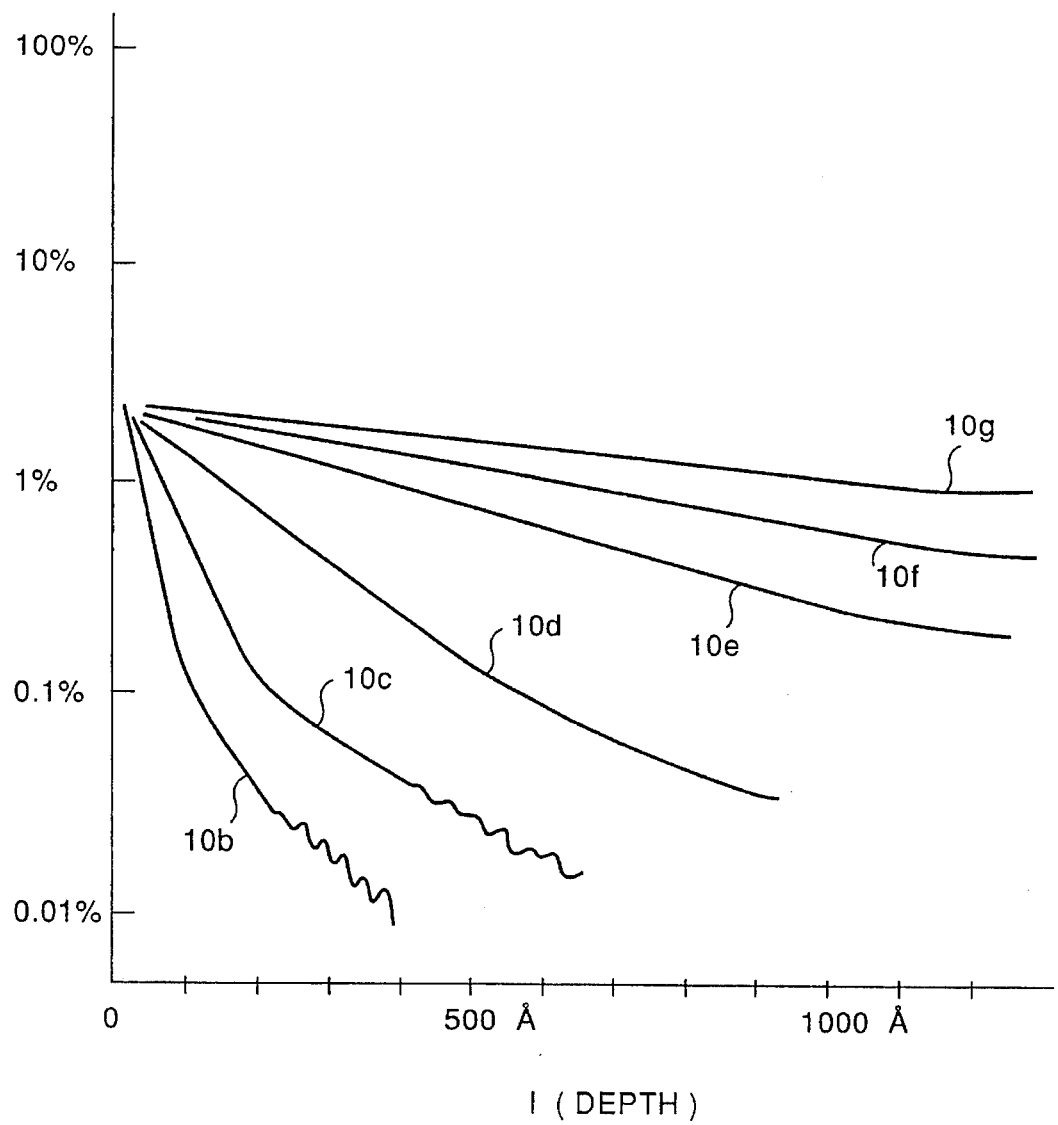
FIG. 10 is a graph showing the results of Si concentration analysis in the samples.

A target was composed of pure aluminum, while the other target was composed of aluminum containing 6 wt. % Si. An Al layer was deposited with such apparatus, on a stainless steel plate of 5×5 cm. In the initial stage of deposition, a voltage was supplied only to the pure aluminum target, thereby depositing pure aluminum. A voltage was also applied to the other target, starting from the middle of the deposition. The applied power (=voltage×current) was gradually increased, and the voltage application was terminated when the powers applied to both targets became mutually equal, thereby completing the film deposition. There were prepared a total of seven samples of Al film containing Si in the vicinity of the surface of the film, with different rates of power increase in the other target, including one deposited with the pure Al target only. The seven samples thus prepared were subjected to an analysis of Si concentration from the surface, by a secondary ion mass spectrometer (SIMS), and the obtained results are summarized in FIG. 10. The depth l where the Si concentration becomes equal to 1/e (≅1%) of the peak value (≅3%) was calculated. Then, on each Al layer, ZnO was deposited with a thickness of 4,000 Å with a substrate temperature of 200° C., whereupon the ZnO layer showed a turbid surface, owing to an irregular surface structure. Seven solar cells (samples 8a–8g) were prepared by applying the glow discharge decomposition as in the experiment 1, on the thus obtained seven substrates. The conversion efficiencies of these samples are summarized in Table 8. The conversion efficiency increased with an increase in l up to 150 Å, indicating the effect of Si addition, but the efficiency decreased somewhat with a further increase in l. These results can be interpreted as follows. Si addition to Al causes a certain loss in reflectance by actual measurement, but the loss is reduced if the Si addition is limited to the vicinity of the surface. On the other hand, the effect of suppressing Al diffusion is reduced if the Si addition is excessively limited to the immediate vicinity of the surface. Consequently, a range of l=50–500 Å can be considered to provide the optimum result.

Experiment 8

The DC magnetron sputtering apparatus used in experiment 7 was employed, with a pure Al target and an aluminum target containing wt. % Zn, for depositing two Al layers, containing about 3 wt. % Zn in the vicinity of the surface of the layer but different in l, in a similar manner as in experiment 7.

Also, two Al layers, containing Mn in about 1% in the vicinity of the surface of the layer but different in l were deposited in a similar manner.

Then, each Al layer was subjected to the deposition of a ZnO layer with irregular surface structure as in experiment 7, and was prepared into a solar cell. The characteristics of the thus prepared solar cells are summarized in Table 9. Also, in this case the conversion efficiency could be maximized by selecting a suitable value of l.

Experiment 9

A pure Cu layer and six Cu layers containing Si atoms in the vicinity of the surface of the layer, were deposited on stainless steel plates as in experiment 7. Each Cu layer was subjected to the deposition of a ZnO layer with irregular surface structure and was prepared into a solar cell. The characteristics of these solar cells are summarized in Table 10. As in the case of the Al layer, the conversion efficiency of the Cu layer could be increased by selecting l within a range of about 50–500 Å.

Experiment 10

A pure Cu layer and two Cu layers containing Zn in the vicinity of the surface with different values of l were deposited on stainless steel plates as in experiment 9. Also, two Cu layers containing Be in the vicinity of the surface, with different values of l were deposited. Each Cu layer was subjected to the deposition of a ZnO layer with an irregular surface structure and was prepared into a solar cell. The characteristics of these solar cells are summarized in Table 11. The conversion efficiency could be maximized by selecting a suitable value for l.

In the following there will be given a more detailed explanation of the rear reflection layer to be employed in the photovoltaic device of the present invention.

Substrate and Metal Layer

The substrate can be composed of various metals. Preferred examples include stainless steel plate, zinc steel plate, aluminum plate, and copper plate as they are relatively inexpensive. Such metal plates may be cut into a predetermined shape or used in the form of a continuous web, depending on the thickness. The continuous web, being coilable, is suitable for a continuous manufacturing process and is also convenient for transportation and storage. For certain applications, there may be employed a sheet- or plate-shaped substrate such as a crystalline substrate, for example, of silicon, glass, or ceramics. The substrate surface may be polished, but may also be used without polishing if the surface is already well finished as in the case of bright annealed stainless steel plate.

A substrate with a low light reflectance such as stainless steel or zincated steel may also be employed by the deposition of a highly reflective aluminum layer thereon. Also, a substrate with a low conductivity such as glass or ceramics may also be employed by forming an aluminum or copper layer thereon.

Figure 6:
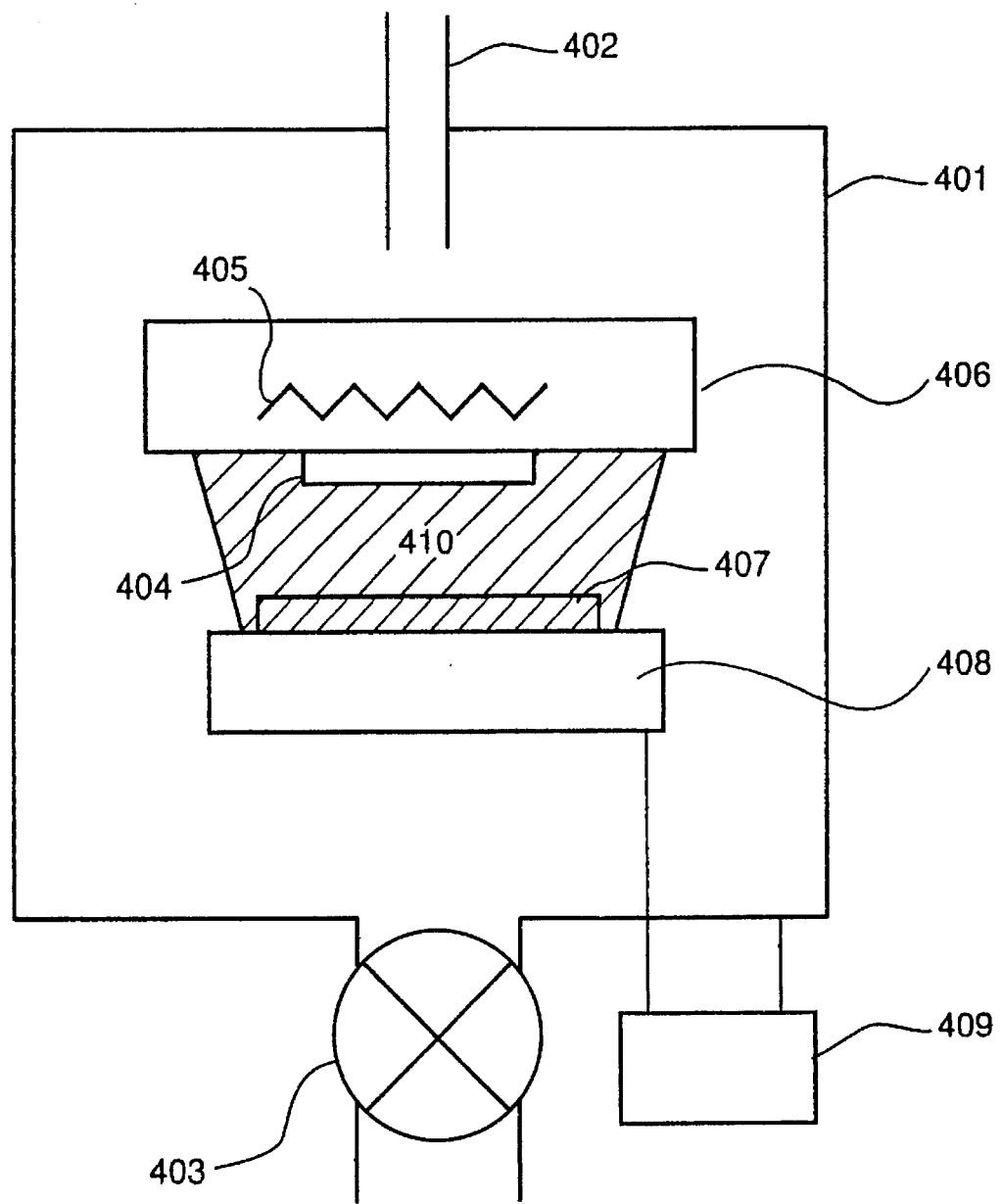
FIG. 6 is a view showing the structure of a sputtering apparatus adapted for use in the preparation of the rear reflection layer of the present invention.

The aluminum layer may be deposited, for example, by vacuum evaporation by resistance heating or by an electron beam, sputtering, ion plating, CVD or plating method. The film formation by sputtering will be explained in the following as an example. FIG. 6 illustrates an example of the sputtering apparatus. In a deposition chamber 401 which can be evacuated by a vacuum pump (not shown), inert gas such as argon (Ar) is introduced with a predetermined flow rate from a gas supply pipe 402 connected to a gas supply container (not shown), and the interior of the deposition chamber 401 is maintained at a predetermined pressure by the regulation of an exhaust valve 403. A substrate 404 is fixed on an anode 406 incorporating a heater 405 therein. Opposed to the anode 406 there is provided a cathode 408 on which a target 407 is fixed. The target 407 is composed of an aluminum block, containing an impurity at a suitable concentration. A power source 409, connected to the cathode, applies a high voltage of a radio frequency (RF) or DC, thereby generating plasma 410 between the cathode and the anode. By the action of the plasma, the metal atoms constituting the target 407 are deposited onto the substrate 404. The deposition speed can be increased in a magnetron sputtering apparatus in which the intensity of plasma is increased by a magnet provided inside the cathode 408.

Deposition conditions were as follows. There were employed a 6-inch Al target of a purity of 99.99%, containing 5% Si and a stainless steel (SUS 430) substrate of a size of 5×5 cm and a thickness of 1 mm with a polished surface, with a mutual distance of 5 cm. Argon was supplied at a flow rate of 10 sccm and a pressure of 1.5 mTorr, and a DC voltage of 500 V was applied, whereby plasma was generated with a current of 2 A. The discharge was contained for 1 minute in this state. Samples 3a, 3b, 3c, and 3d were prepared with respective substrate temperatures of room temperature, 100°, 200°, and 300° C. Table 3 summarizes the appearances and the results of SEM observations of these samples. An apparent change of the aluminum surface from a smooth state to an irregular state was observed with the temperature increase. A similar tendency was observed also with the other film forming methods.

Addition of an impurity metal into the Al layer may be achieved by the addition of the desired impurity in the evaporation source or in the target, or, in case of sputtering, by placing a small piece of material containing such impurity on the target.

The copper layer also can be deposited by vacuum deposition by resistance heating or by an electron beam, sputtering, ion plating, CVD, or plating method. The film formation by sputtering will be explained in the following as an example.

Deposition conditions were as follows. There were employed a 6-inch Cu target of a purity of 99.99%, containing 5% Si and a stainless steel (SUS 430) substrate of a size of 5×5 cm and a thickness of 1 mm with a polished surface, with a mutual distance of 5 cm. Argon was supplied at a flow rate of 10 sccm and a pressure of 1.5 mTorr, and a DC voltage of 500 V was applied, whereby plasma was generated with a current of 2 A. The discharge was continued for 1 minute in this state. Samples 7a, 7b, 7c, and 7d were prepared with respective substrate temperatures of room temperature, 100°, 200°, and 300° C. Table 7 summarizes the appearances and the results of SEM observations of these samples. An apparent change of the copper surface from a smooth state to an irregular state was observed with the temperature increase. A similar tendency was observed also with the other film forming methods.

Addition of an impurity metal into the Cu layer may be achieved by the addition of the desired impurity in the evaporation source or in the target, or, in case of sputtering, by placing a small piece of material containing such impurity on the target.

Transparent Conductive Layer and its Irregular Surface Structure

The transparent conductive layer is often composed of an oxide such as ZnO, $In_2O_3$, $SnO_2$, CdO, $CdSnO_4$ or TiO (However, the composition ratio of these compounds does not necessarily coincide with the actual state.). The light transmittance of the transparent layer should generally be as high as possible, but it need not be transparent to the light of the spectral region absorbed by the thin semiconductor films. The transparent layer preferably has a certain resistance, in order to suppress the current, for example, caused by the pinholes. On the other hand, the resistance should be in such a range that the series resistance loss does not affect the conversion efficiency of the solar cell. Based on such standpoint, the resistance per unit area (1 $cm^2$) is preferably within a range of $10^{-6}$ to 10 Ω, more preferably $10^{-5}$ to 3 Ω and most preferably $10^{-4}$ to 1 Ω. Also, the thickness of the transparent layer should preferably be as small as possible in consideration of the transparency, but it should be on average at least 1,000 Å in order to attain the irregular surface structure, and an even larger thickness may become necessary in consideration of the reliability. The irregular surface structure will be explained layer in more detail.

The deposition of the transparent layer may be achieved by vacuum evaporation by resistance heating or by an electron beam, sputtering, ion plating, CVD, or spray coating method. The sputtering method is explained by way of example. In the case of sputtering, the sputtering apparatus shown in FIG. 6 may be employed. In the case of depositing an oxide film, a target of the oxide itself, or a metal target (for example, Zn or Sn) may be employed. In the latter case, oxygen has to be supplied to the deposition chamber, together with argon, and such deposition is called reactive sputtering.

Figure 7:
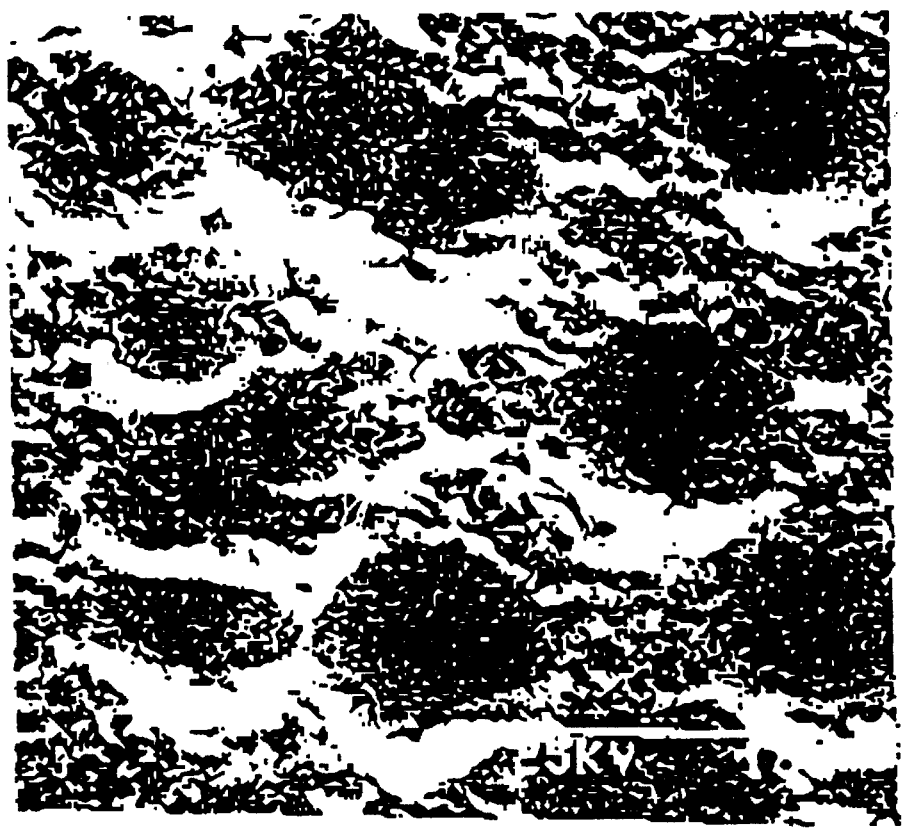
FIG. 7 is a scanning electron photo-micrograph of the transparent layer having an irregular surface structure.

Deposition conditions were as follows. There were employed a 6-inch ZnO target of a purity of 99.99% and a stainless steel substrate (SUS 430) of a size of 5×5 cm and a thickness of 1 mm with a polished surface, with a mutual distance of 5 cm. Argon was supplied at a flow rate of 10 sccm with a pressure of 1.5 mTorr, and a DC voltage was applied, whereby plasma was generated with a current of 1 A. The discharge was continued for 5 minutes in this state. Samples 4a, 4b, 4c, and 4d were prepared with respective substrate temperatures of room temperature, 100°, 200°, and 300° C. Table 4 summarizes the appearances and the results of SEM observation of these samples. The surface state of the ZnO layer showed variation when the temperature was elevated. In the samples 4c and 4d which showed turbidity, there were observed crater-shaped recesses on the surface, which were considered as the cause of the turbidity (FIG. 7).

In the case where the metal layer has an irregular structure, the light trapping by the irregular structure is ascribable to light scattering in the metal layer (FIG. 1), but, in the case where the metal layer is smooth while the transparent layer has the irregular surface structure (FIG. 2), it is ascribable to the scattering caused by phase aberration of the incident light between the protruding portions and recessed portions, at the surface of the thin semiconductor film and/or at the interface with the transparent layer. The irregular structure preferably has a pitch of 3,000 to 20,000 Å, more preferably 4,000 to 15,000 Å and a height difference preferably within a range of 500 to 20,000 Å, more preferably 700 to 10,000 Å. If the surface of the thin semiconductor film has an irregular structure similar to that of the surface of the transparent layer, the light scattering based on phase difference is facilitated, so that an enhanced light trapping effect can be obtained.

Example 1

In the present example there was prepared a PIN a-Si thin film semiconductor solar cell of the configuration shown in FIG. 1. On a stainless steel plate 101 of a size of 5×5 cm and a thickness of 1 mm, with a polished surface, there was deposited an aluminum layer 102 of an average thickness of 4,000 Å with an irregular surface structure, by the apparatus shown in FIG. 6, with an Al target containing 2% Si and with a substrate temperature of 250° C. Then a ZnO layer 103 with an average thickness of 700 Å was deposited with a ZnO target and a substrate temperature of 100° C.

Subsequently, the substrate bearing the thus formed rear reflection layer was set in a commercial capacity-coupled RF-CVD apparatus (ULVAC model CHJ-3030). The reaction chamber was evacuated at first roughly and then to high vacuum, by a vacuum pump connected through an exhaust pipe. The substrate surface temperature was controlled at 250° C. by a temperature control mechanism. After sufficient evacuation, there were introduced, through gas introducing pipes, $SiH_4$ at 300 sccm, $SiF_4$ at 4 sccm, $PH_3/H_2$ (diluted to 1% with $H_2$) at 55 sccm, and $H_2$ at 40 sccm, and the internal pressure of the reaction chamber was maintained at 1 Torr by regulation of the aperture of a throttle valve. When the pressure was stabilized, electrical power of 200 W was supplied from a high frequency power source. The plasma was maintained for 5 minutes, whereby an n-type a-Si layer 105 was formed on the transparent layer 103. After evacuation again, there were introduced $SiH_4$ at 300 sccm, $SiF_4$ at 4 sccm and $H_2$ at 40 sccm, and the internal pressure of the reaction chamber was maintained at 1 Torr by regulation of the aperture of the throttle valve. When the pressure was stabilized, electrical power of 150 W was supplied from the high frequency power source, and the plasma was maintained for 40 minutes, whereby an i-type a-Si layer 106 was formed on the n-type a-Si layer 105. After evacuation again, there were introduced $SiH_4$ at 50 sccm, $BF_3/H_2$ (diluted to 1% with $H_2$) at 50 sccm, and $H_2$ at 500 sccm, and the internal pressure of the reaction chamber was maintained at 1 Torr by regulation of the aperture of the throttle valve. When the pressure was stabilized, electrical power of 300 W was supplied from the high frequency power source, and the plasma was maintained for 2 minutes, whereby a p-type microcrystalline-Si layer 107 was formed on the i-type a-Si layer 106. The sample was then taken out from the RF-CVD apparatus, subjected to the deposition of an ITO layer in a resistance-heated vacuum evaporation apparatus, and then subjected to the printing of paste containing an aqueous solution of ferric chloride to form a desired pattern of the transparent electrode 108. Finally, a current-collecting electrode 109 was formed by screen printing of Ag paste, whereby a thin film semiconductor solar cell was completed. Ten samples were prepared in this manner and subjected to the evaluation of characteristics under the irradiation of light of AM-1.5 (100 mW/cm$^2$), whereby a photoelectric conversion efficiency of 8.1±0.3% was reproducibly obtained. Also, these solar cells, after being left under a condition of a temperature of 50° C. and a humidity of 90% for 1,000 hours, showed a conversion efficiency of 7.8±0.5%, with almost no deterioration.

Example 2

In this example there was prepared a PIN a-SiGe thin film semiconductor solar cell of the configuration shown in FIG. 2. On a stainless steel plate of a size of 5×5 cm and a thickness of 1 mm, with a polished surface, an Al layer of a thickness of 1,500 Å with a smooth surface was deposited by an ion plating method employing Al containing 1 wt. % Cu in 1 wt. %, with the substrate being at room temperature. Then a SnO$_2$ layer having an irregular surface structure was deposited with an average thickness of 1 micron, by an ion plating method employing Sn in an oxygen atmosphere, with a substrate temperature of 350° C.

The subsequent process was same as in example 1, except that the i-type layer was composed of a-SiGe, deposited by introducing S$_2$H$_6$ at 50 sccm, GeH$_4$ at 10 sccm, and H$_2$ at 300 sccm, maintaining the internal pressure of the reaction chamber at 1 Torr, applying electric power of 100 W, and maintaining the plasma for 10 minutes. 10 samples were prepared in this manner and evaluated under the irradiation with light of AM-1.5 (100 W/cm$^2$), whereby a high photoelectric conversion efficiency of 8.4±0.4% was reproducibly obtained. In this case a particularly high reflectance seems to have been obtained by the smooth Al surface.

Example 3

Figure 8:
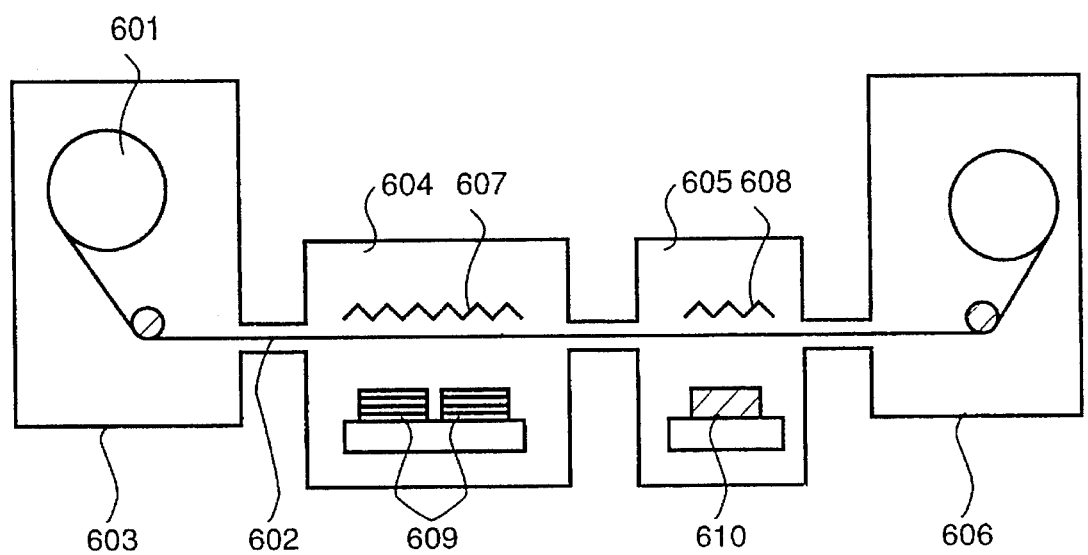
FIG. 8 is a view showing the structure of another sputtering apparatus adapted for use in the preparation of the rear reflection layer of the present invention.

A rear reflection layer was continuously formed by the apparatus shown in FIG. 8. In a substrate feeding chamber 603 there was provided a roll 601 of an already washed stainless steel sheet 602 of a width of 350 mm, a thickness of 0.2 mm and a length of 500 m. The sheet 602 was supplied, through a metal layer deposition chamber 604 and a transparent layer deposition chamber 605, to a substrate winding chamber 606. In the deposition chambers, the sheet 602 could be heated to desired temperatures by heaters 607, 608. In the chamber 604 there was provided a target 609 consisting of Al of a purity of 99.99% (containing 2% Zn for depositing an Al layer on the sheet 602 by DC magnetron sputtering. In the deposition chamber 605 there was provided a target 610 of ZnO of a purity of 99.9% for depositing a ZnO layer by DC magnetron sputtering. There were provided two targets 609, in consideration of the desired thickness and the deposition speed.

This apparatus was employed for forming a rear reflection layer. The sheet was advanced at a speed of 20 cm per minute, and the heater 607 was so regulated as to heat the substrate to 250° C. during the Al deposition. Argon was supplied at a pressure of 1.5 mTorr, and a DC voltage of 500 V was supplied to the cathodes. There were obtained a current of 6 A in each target 609 and a current of 4 A in the target 610. The wound sheet was provided with an Al layer with an average thickness of 3,000 Å and a ZnO layer with an average thickness of 800 Å, and the Al surface was turbid.

Figure 9:
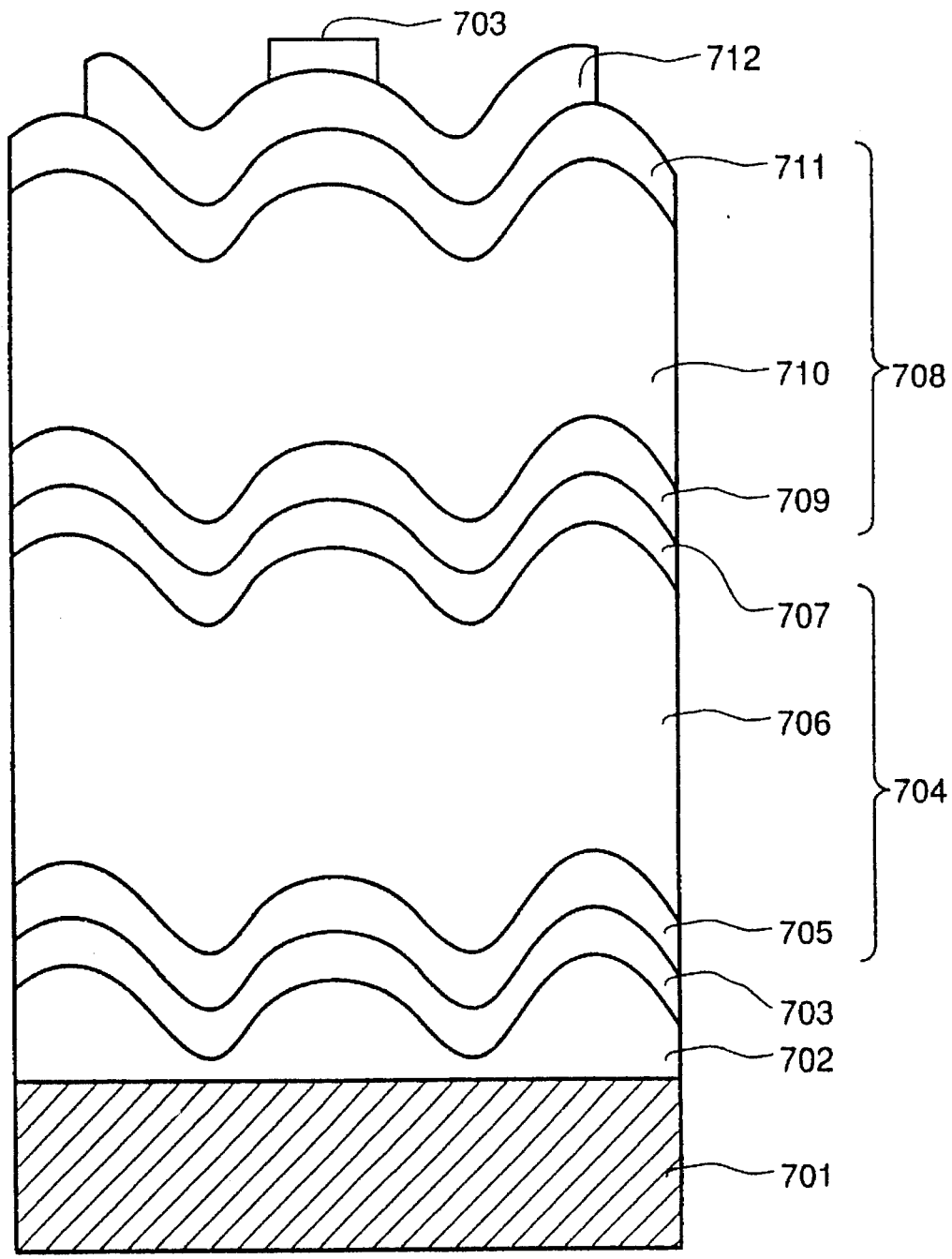
FIG. 9 is a cross-sectional view of another embodiment of a thin film semiconductor solar cell of the present invention.

On the thus obtained reflection layer, there was formed an a-Si/a-SiGe tandem solar cell of a configuration shown in FIG. 9, wherein there are shown a substrate 701; an aluminum layer 702; a ZnO layer 703; a bottom cell 704; a top cell 708; n-type a-Si layers 705, 709; p-type microcrystalline-Si layers 707, 711; an i-type a-SiGe layer 706; and an i-type a-Si layer 710. These semiconductor layers were formed continuously by a roll-to-roll film forming apparatus as disclosed in the U.S. Pat. No. 4,492,181. A transparent electrode 712 was deposited by a sputtering apparatus similar to the one shown in FIG. 8. There is also shown a current-collecting electrode 703. After the patterning of the transparent electrode and the formation of the current-collecting electrode the sheet 602 was cut into individual pieces. Mass producibility was thus attained by the continuous performance of the entire process.

100 samples prepared in this manner provided, in a reproducible manner, when evaluated under irradiation by light of AM-1.5 (100 mW/cm$^2$), an excellent photoelectric conversion efficiency of 10.4±0.2%. Also, after standing under conditions of a temperature of 50° C. and a humidity of 90% for 1,000 hours, the conversion efficiency of these solar cells was 10.0±0.5% with almost no deterioration. Also, another 100 samples prepared in the same manner showed little deterioration by light, as the conversion efficiency was 9.8±0.3% after irradiation by AM-1.5 light for 600 hours under open circuit conditions. These results were obtained because of a higher output voltage realized by the effective absorption of light in a longer wavelength region by the tandem configuration, and also because of the reduced deterioration of the thin semiconductor films under the light irradiation. Thus there could be obtained a thin film solar cell of a high conversion efficiency and a high reliability, in combination with the effect of the rear reflection layer of the present invention.

Example 4

A rear reflection layer was formed in the same manner as in the sample 1a of the experiment 1, except that an Al layer containing 2 wt. % Mn was employed. A substrate thus processed, and another substrate without the Al and ZnO layers were subjected to the deposition of Cu layer of 0.2 microns and an In layer of 0.4 microns by sputtering. The samples were then placed in a quartz glass chamber and subjected to the formation of a CuInSe$_2$ (CIS) layer by supplying Z$_2$Se diluted to 10% with hydrogen into the chamber while heating the substrates to 400° C. Each sample was then subjected to the deposition of a CdS layer of a thickness of 0.1 microns by sputtering, then annealed at 250° C. to form a p/n junction, and subjected to the formation of a transparent electrode and a current-collecting electrode in the same manner as in example 1.

These solar cells were subjected to the evaluation of photovoltaic characteristics under irradiation by light of AM-1.5 (100 mW/cm$^2$). The solar cell with the Al and ZnO layers showed a conversion efficiency as high as 8.9%, while the solar cell lacking the layers showed an efficiency of only 7.3%, thus proving that the present invention is effective with thin semiconductor films other than a-Si.

Example 5

In the present example, there was prepared a PIN a-Si thin film semiconductor solar cell of the configuration shown in FIG. 1. On a stainless steel plate 101 of a size of 5×5 cm and a thickness of 1 mm, with a polished surface, there was deposited a copper layer 102 of an average thickness of 4,000 Å with an irregular surface structure, by the apparatus shown in FIG. 6, with a Cu target containing 3% Si and a substrate temperature of 220° C. Then a ZnO layer 103 with an average thickness of 700 Å was deposited with a ZnO target and a substrate temperature of 100° C.

Subsequently, the substrate bearing the thus formed rear reflection layer was placed in a commercial capacity-coupled RF-CVD apparatus (ULVAC model CHJ-3030). The reaction chamber was evacuated at first roughly and then to high vacuum, by a vacuum pump connected through an exhaust pump. The substrate surface temperature was controlled at 250° C. by a temperature control mechanism. After sufficient evacuation, there were introduced, through gas introducing pipes, $SiH_4$ at 300 sccm, $SiF_4$ at 4 sccm, $PH_3/H_2$ (diluted to 1% with $H_2$) at 55 sccm, and $H_2$ at 40 sccm, and the internal pressure of the reaction chamber was maintained at 1 Torr by regulation of the aperture of a throttle valve. When the pressure was stabilized, electrical power of 200 W was supplied from a high frequency power source. The plasma was maintained for 5 minutes, whereby an n-type a-Si layer 105 was formed on the transparent layer 103. After evacuation again, there were introduced $SiH_4$ at 300 sccm, $SiF_4$ at 4 sccm, and $H_2$ at 40 sccm, and the internal pressure of the reaction chamber was maintained at 1 Torr by regulation of the aperture of the throttle valve. When the pressure was stabilized, electrical power of 150 W was supplied from the high frequency power source, and the plasma was maintained for 40 minutes, whereby an i-type a-Si layer 106 was formed on the n-type a-Si layer 105. After evacuation again, there were introduced $SiH_4$ at 50 sccm, $BF_3H_2$ (diluted to 1% with $H_2$) at 50 sccm, and $H_2$ at 500 sccm, and the internal pressure of the reaction chamber was maintained at 1 Torr by regulation of the aperture of the throttle valve. When the pressure was stabilized, electrical power of 300 W was supplied from the high frequency power source, and the plasma was maintained for 2 minutes, whereby a p-type microcrystalline-Si layer 107 was formed on the i-type a-Si layer 106. The sample was then taken out from the RF-CVD apparatus, then subjected to the deposition of an ITO layer in a resistance-heated vacuum evaporation apparatus, and subjected to the printing of paste containing an aqueous solution of ferric chloride to form a desired pattern of the transparent electrode 108. Finally, a current-collecting electrode 109 was formed by screen printing of Ag paste, whereby a thin film semiconductor solar cell was completed. 10 samples were prepared in this manner and subjected to the evaluation of characteristics under the irradiation of light of AM-1.5 (100 mW/cm$^2$), whereby a high photoelectric conversion efficiency of 8.4±0.4% was reproducibly obtained. Also, these solar cells, after standing under a condition of a temperature of 50° C. and a humidity of 90% for 1,000 hours, showed a conversion efficiency of 8.1±0.4%, with almost no deterioration.

Example 6

In this example there was prepared a PIN a-SiGe thin film semiconductor solar cell of the configuration shown in FIG. 2. On a stainless steel plate of a size of 5×5 cm and a thickness of 1 mm, with a polished surface, a Cu layer of a thickness of 1,5000 Å with smooth surface was deposited by an ion plating method employing Cu containing 1 wt. % Zn, with the substrate at room temperature. Then, a $SnO_2$ layer having an irregular surface structure was deposited with an average thickness of 1 micron, by an ion plating method employing Sn in an oxygen atmosphere, with a substrate temperature of 350° C.

The subsequent process was the same as in example 5, except that the i-type layer was composed of a-SiGe, deposited by introducing $Si_2H_6$ at 50 sccm, $GeH_4$ at 10 sccm, and $H_2$ at 300 sccm, maintaining the internal pressure of the reaction chamber at 1 Torr, applying an electric power of 100 W, and maintaining the plasma for 10 minutes. 10 samples were prepared in this manner and evaluated under irradiation with light of AM-1.5 (100 W/cm$^2$), whereby a high photoelectric conversion efficiency of 8–9±0.4% was reproducibly obtained. In comparison with the optical band gap of about 1.7 eV in a-Si, a-SiGe has a narrower optical band gap of about 1.45 eV, providing a higher sensitivity for the longer wavelength region, so that the rear reflection layer composed of Cu, having a higher reflectance at the longer wavelength region, was extremely effective. Also, a particularly high reflectance seems to have been obtained by the smooth Cu surface.

Example 7

A rear reflection layer was continuously formed by an apparatus shown in FIG. 8. In a substrate feeding chamber 603 there was placed a roll 601 of an already washed stainless steel sheet of a width of 350 mm, a thickness of 0.2 mm, and a length of 500 m. The sheet 602 was supplied, through a metal layer deposition chamber 604 and a transparent layer deposition chamber 605, to a substrate winding chamber 606. In the deposition chambers, the sheet 602 could be heated to desired temperatures by heaters 607, 608. In the chamber 604 there was provided a target 609 consisting of Cu of a purity of 97.99% (containing 2.0% Sn) for depositing a Cu layer on the sheet 602 by DC magnetron sputtering. In the deposition chamber 605 there was provided a target 610 of ZnO of a purity of 99.9% for depositing a ZnO layer by DC magnetron sputtering. There were provided two targets 609, in consideration of the desired thickness and the deposition speed.

This apparatus was employed for forming a rear reflection layer. The sheet was advanced at a speed of 20 cm per minute, and the heater 607 was regulated as to heat the substrate to 220° C. during the Al deposition. Argon was supplied at a pressure of 1.5 mTorr, and a DC voltage of 500 V was supplied to the cathodes. There were obtained a current of 6 A in each target 609 and a current of 4 A in the target 610. The wound sheet was provided with a Cu layer of an average thickness of 2,800 Å and a ZnO layer of an average thickness of 800 Å, and the Cu surface was turbid.

On the thus obtained reflection layer, there was formed an a-Si/a-SiGe tandem solar cell of a configuration shown in FIG. 9, as explained above in connection with Example 3.

100 samples prepared in this manner provided, in a reproducible manner, when evaluated under the irradiation of light of AM-1.5 (100 mW/cm$^2$), an excellent photoelectric conversion efficiency of 10.8± 0.3%. Also, after standing under conditions of a temperature of 50° C. and a humidity of 90% for 1,000 hours, the conversion efficiency of these solar cells was 10.6±0.5%, with almost no deterioration. Also, another 100 samples prepared in the same manner showed little deterioration by light, as the conversion efficiency was 10.0±0.3% after irradiation by AM-1.5 light for 600 hours under open circuit conditions. These results were obtained because of a higher output voltage realized by the effective absorption of light in a longer wavelength region by the tandem configuration, and also because of the reduced deterioration of the thin semiconductor films under the light irradiation. Thus there could be obtained a thin film solar cell of a high conversion efficiency and a high reliability, in combination with the effect of the rear reflection layer of the present invention.

Example 8

A rear reflection layer was formed in the same manner as in the sample 1a of experiment 1, except that a Cu layer containing 2 wt. % Be was employed. A substrate thus processed, and another substrate without the Cu and ZnO layers were subjected to the deposition by sputtering of a Cu layer of 0.2 micron thickness and an In layer of 0.4 micron thickness. The samples were then placed in a quartz glass chamber and subjected to the formation of a $CuInSe_2$ (CIS) layer by supplying $H_2Se$ diluted to 10% with hydrogen into the chamber while heating the substrates to 400° C. Each sample was then subjected to the deposition of a CdS layer of a thickness of 0.1 micron by sputtering, then annealed at 250° C. to form a p/n junction, and subjected to the formation of a transparent electrode and a current-collecting electrode in the same manner as in example 5.

These solar cells were subjected to the evaluation of photovoltaic characteristics under irradiation by light of AM-1.5 (100 mW/cm$^2$). The solar cell with the Cu and ZnO layers showed a conversion efficiency as high as 9.8%, while the solar cell lacking the layers showed an efficiency of only 7.3%, thus proving that the present invention was effective with thin semiconductor films other than a-Si.

The rear reflection layer of the present invention increases the light reflectance, and induces effective light trapping within the thin semiconductor films, thereby increasing the light absorption therein and thus providing a photovoltaic device of a high conversion efficiency. Also, the reliability thereof is improved as the diffusion of the metal atoms into the transparent layer and further into the semiconductor films is suppressed. In the case where the surface area is increased, for example by the irregular surface structure, the improvement in reliability is conspicuous, particularly by the suppression of metal diffusion. In addition, such rear reflection layer can be prepared as a part of a mass production method, such as the roll-to-roll production process. Consequently, the present invention can contribute greatly to the increased use of solar power generation.

TABLE 1

| Sample | Substrate | Metal layer | Transparent layer | Conversion efficiency |
| --- | --- | --- | --- | --- |
| 1a | stainless steel plate (SUS 430) | Al containing 10% Si, with irregular structure | ZnO | 8.0% |
| 1b | ibid. | Al containing 3% Si, with irregular structure | ZnO | 8.2% |
| 1c | ibid. | Al containing 0.5% Si, with irregular structure | ZnO | 8.1% |
| 1d | ibid. | pure Al | ZnO | 3.5% |
| 1e | ibid. | Al containing 3% Si, with smooth structure | ZnO with irregular structure | 9.6% |

TABLE 2

| Sample | Substrate | Metal layer | Transparent layer | Conversion efficiency |
| --- | --- | --- | --- | --- |
| 2a | stainless steel plate (SUS 430) | Al containing 3% Zn, with irregular structure | ZnO | 8.1% |
| 2b | ibid. | Al containing 3% Cu, with irregular structure | ZnO | 8.3% |
| 2c | ibid. | Al containing 1% Mn, with irregular structure | ZnO | 8.4% |

TABLE 3

| Sample | Substrate temp. | Appearance | SEM observation |
| --- | --- | --- | --- |
| 3a | room temp. | lustrous | irregularity with a pitch of about 1000 Å |
| 3b | 100° C. | some turbidity | irregularity with a pitch of about 1500 Å |
| 3c | 200° C. | turbid | irregularity with a pitch of about 3000 Å to 6000 Å |
| 3d | 300° C. | turbid | irregularity with a pitch of about 4000 Å to 8000 Å |

TABLE 4

| Sample | Substrate temp. | Appearance | SEM observation |
| --- | --- | --- | --- |
| 4a | room temp. | lustrous, yellowish | irregularity with a pitch of about 1000 Å |
| 4b | 100° C. | transparent, lustrous | irregularity with a pitch of about 1500 Å |
| 4c | 200° C. | turbid | irregularity with a pitch of about 3000 Å to 7000 Å |
| 4d | 300° C. | turbid | irregularity with a pitch of about 4000 Å to 9000 Å |

TABLE 5

| Sample | Substrate | Metal layer | Transparent layer | Conversion efficiency |
| --- | --- | --- | --- | --- |
| 5a | stainless steel plate (SUS 430) | Cu containing 10% Si, with irregular structure | ZnO | 8.4% |
| 5b | ibid. | Cu containing 3% Si, with irregular structure | ZnO | 8.6% |
| 5c | ibid. | Cu containing 0.5% Si, with irregular structure | ZnO | 8.2% |
| 5d | ibid. | pure Cu, with irregular structure | ZnO | 7.5% |
| 5e | ibid. | Cu containing 3% Si, with smooth surface | ZnO with irregular structure | 9.7% |
| 5f | ibid. | pure Cu, with smooth surface | ZnO with irregular structure | 2.6% |

TABLE 6

| Sample | Substrate | Metal layer | Transparent layer | Conversion efficiency |
|---|---|---|---|---|
| 6a | stainless steel plate (SUS 430) | Cu containing 3% Al, with irregular structure | ZnO | 8.3% |
| 6b | ibid. | Cu containing 3% Zn, with irregular structure | ZnO | 8.4% |
| 6c | ibid. | Cu containing Sn in 3%, with irregular structure | ZnO | 8.0% |
| 6d | ibid. | Cu containing 1% Be, with irregular structure | ZnO | 8.2% |

TABLE 7

| Sample | Substrate temp. | Appearance | SEM observation |
|---|---|---|---|
| 7a | room temp. | lustrous | irregularity with a pitch of about 200 Å |
| 7b | 100° C. | somewhat turbid | irregularity with a pitch of about 300 Å |
| 7c | 200° C. | turbid | irregularity with a pitch of about 500 Å to 10000 Å |
| 7d | 300° C. | turbid | irregularity with a pitch of about 7000 Å to 20000 Å |

TABLE 8

| Sample | Substrate | Metal layer | Transparent layer | Conversion efficiency |
|---|---|---|---|---|
| 8a | stainless steel plate | pure Al | ZnO with irregular structure | 5.7% |
| 8b | ibid. | Surface Si concentration = 3%, l = 30 Å | Ibid. | 7.8% |
| 8c | ibid. | Surface Si concentration = 3%, l = 60 Å | Ibid. | 9.8% |
| 8d | ibid. | Surface Si concentration = 3%, l = 150 Å | Ibid. | 10.0% |
| 8e | Ibid. | Surface Si concentration = 3%, l = 380 Å | Ibid. | 9.9% |
| 8f | Ibid. | Surface Si concentration = 3%, l = 620 Å | Ibid. | 9.6% |
| 8g | Ibid. | Surface Si concentration = 3%, l = 1000 Å | Ibid. | 9.5% |

TABLE 9

| Sample | Substrate | Metal layer | Transparent layer | Conversion efficiency |
|---|---|---|---|---|
| 9a | stainless steel plate | pure Al | ZnO with irregular structure | 5.7% |
| 9b | ibid. | Surface Zn concentration = 3%, l = 200 Å | Ibid. | 10.1% |
| 9c | ibid. | Surface Zn concentration = 3%, l = 1000 Å | Ibid. | 9.4% |
| 9d | ibid. | Surface Mn concentration = 3%, l = 250 Å | Ibid. | 9.9% |
| 9e | Ibid. | Surface Mn concentration = 1%, l = 900 Å | Ibid. | 9.3% |

TABLE 10

| Sample | Substrate | Metal layer | Transparent layer | Conversion efficiency |
|---|---|---|---|---|
| 10a | stainless steel plate | pure Cu | ZnO with irregular structure | 1.8% |
| 10b | ibid. | surface Si concentration = 3%, l = 40Å | ibid. | 7.6% |
| 10c | ibid. | surface Si concentration = 3%, l = 70Å | ibid. | 9.9% |
| 10d | ibid. | surface Si concentration = 3%, l = 180Å | ibid. | 10.2% |
| 10e | ibid. | surface Si concentration = 3%, l = 400Å | ibid. | 10.0% |
| 10f | ibid. | surface Si concentration = 3%, l = 650Å | ibid. | 9.7% |
| 10g | ibid. | surface Si concentration = 3%, l = 950Å | ibid. | 9.6% |

TABLE 11

| Sample | Substrate | Metal layer | Transparent layer | Conversion efficiency |
|---|---|---|---|---|
| 11a | stainless steel plate | pure Cu | ZnO with irregular structure | 1.8% |
| 11b | ibid. | surface Zn concentration = 3%, l = 220Å | ibid. | 10.1% |
| 11c | ibid. | surface Zn concentration = 3%, l = 950Å | ibid. | 9.5% |
| 11d | ibid. | surface Sn concentration = 3%, l = 300Å | ibid. | 10.0% |
| 11e | ibid. | surface Sn concentration = 3%, l = 1100Å | ibid. | 9.3% |
| 11f | ibid. | surface Be concentration = 3%, l = 200Å | ibid. | 10.3% |
| 11g | ibid. | surface Be concentration = 3%, l = 1050Å | ibid. | 9.7% |

What is claimed is:

1. A photovoltaic device comprising a metal layer, a transparent conductive layer formed on said metal layer, and a semiconductor layer provided on said transparent layer and capable of photoelectric conversion, wherein said metal layer is composed of aluminum containing at least one element selected from copper, zinc, and manganese.

2. A photovoltaic device according to claim 1, wherein the at least one element is copper and its concentration is within a range from 0.5 to 10.0 wt. %.

3. A photovoltaic device according to claim 1, wherein the at least one element is zinc and its concentration is within a range from 0.5 to 10.0 wt. %.

4. A photovoltaic device according to claim 1, wherein the at least element is manganese and its concentration is within a range from 0.1 to 2.0 wt. %.

5. A photovoltaic device according to claim 1, wherein the concentration of said at least one element has a decreasing distribution in the direction of thickness, reaching 1/e, wherein e is the base of natural logarithms, within a range from 50 to 500 Å from the surface of the metal layer adjacent to the transparent conductive layer.

6. A photovoltaic device according to claim 1, wherein at least the surface of said transparent conductive layer has an irregular structure.

7. A photovoltaic device comprising a metal layer, a transparent conductive layer formed on said metal layer, and a semiconductor layer provided on said transparent layer and capable of photoelectric conversion, wherein said metal layer is composed of copper containing at least one element selected from silicon, aluminum, zinc, tin, and beryllium.

8. A photovoltaic device according to claim 7, wherein the at least one element is silicon and its concentration is within a range from 0.5 to 10.0 wt. %.

9. A photovoltaic device according to claim 7, wherein the at least one element is aluminum and its concentration is within a range from 0.5 to 10.0 wt. %.

10. A photovoltaic device according to claim 7, wherein the at least one element is zinc and its concentration is within a range from 0.5 to 10.0 wt. %.

11. A photovoltaic device according to claim 7, wherein the at least one element is tin and its concentration is within a range from 0.5 to 10.0 wt. %.

12. A photovoltaic device according to claim 7, wherein the at least one element is beryllium and its concentration is within a range from 0.1 to 2.0 wt. %.

13. A photovoltaic device according to claim 7, wherein the concentration of said at least one element has a decreasing distribution in the direction of thickness, reaching 1/e, wherein e is the base of natural logarithms, within a range from 50 to 500 Å from the surface of the metal layer adjacent to the transparent conductive layer.

14. A photovoltaic device according to claim 7, wherein at least the surface of said transparent conductive layer has an irregular structure.

* * * * *

UNITED STATES PATENT AND TRADEMARK OFFICE
CERTIFICATE OF CORRECTION

PATENT NO. : 5,486,238
DATED : January 23, 1996
INVENTOR(S) : KATSUMI NAKAGAWA ET AL.

It is certified that error appears in the above-indentified patent and that said Letters Patent is hereby corrected as shown below:

In the drawings

S9, FIG. 9

"703" (first occurrence) should read --713--.

COLUMN 2

Line 29, "pp. -110)" should read --pp. 99-110)--.

COLUMN 4

Line 31, "if" should read --is--.

COLUMN 6

Line 26, "(bin)" should read --(Mn)--.

COLUMN 7

Line 5, "700–" should read --700 Å--.

COLUMN 10

Line 46, "contained" should read --continued--.

COLUMN 11

Line 38, "Ωand" should read --Ω and--.
Line 44, "layer" should read --later--.

UNITED STATES PATENT AND TRADEMARK OFFICE
CERTIFICATE OF CORRECTION

PATENT NO. : 5,486,238
DATED : January 23, 1996
INVENTOR(S) : KATSUMI NAKAGAWA ET AL.

It is certified that error appears in the above-indentified patent and that said Letters Patent is hereby corrected as shown below:

COLUMN 13

Line 33, "$S_2H_6$" should read --$Si_2H_6$--.
Line 54, "Zn" should read --Zn)--.

COLUMN 14

Line 15, "electrode 703." should read --electrode 713.--.

COLUMN 15

Line 34, "$BF_3H_2$" should read --$BF_3/H_2$--.
Line 64, "1,5000 Å" should read --1,500 Å--.

COLUMN 21

Line 10, "element" should read --one element--.

Signed and Sealed this

Twenty-third Day of July, 1996

Attest:

BRUCE LEHMAN

Attesting Officer     Commissioner of Patents and Trademarks